United States Patent
Hatsukawa et al.

(10) Patent No.: US 8,917,142 B2
(45) Date of Patent: Dec. 23, 2014

(54) SWITCHING CIRCUIT AND ENVELOPE SIGNAL AMPLIFIER

(71) Applicants: Sumitomo Electric Industries, Ltd., Osaka-shi (JP); National University Corporation Toyohashi University of Technology, Toyohashi-shi (JP)

(72) Inventors: Satoshi Hatsukawa, Osaka (JP); Kazuhiro Fujikawa, Osaka (JP); Takashi Tsuno, Osaka (JP); Nobuo Shiga, Osaka (JP); Takashi Ohira, Toyohashi (JP); Kazuyuki Wada, Toyohashi (JP); Tuya Wuren, Toyohashi (JP); Kotaro Tanimura, Toyohashi (JP)

(73) Assignees: Sumitomo Electric Industries, Ltd., Osaka-shi (JP); National University Corporation Toyohashi University of Technology, Toyohashi-shi (JP)

( * ) Notice: Subject to any disclaimer, the term of this patent is extended or adjusted under 35 U.S.C. 154(b) by 85 days.

(21) Appl. No.: 13/662,083

(22) Filed: Oct. 26, 2012

(65) Prior Publication Data
US 2013/0135046 A1 May 30, 2013

Related U.S. Application Data

(60) Provisional application No. 61/563,719, filed on Nov. 25, 2011.

(30) Foreign Application Priority Data

Nov. 24, 2011 (JP) ................................ 2011-256130

(51) Int. Cl.
*H03F 3/45* (2006.01)
*H03K 17/687* (2006.01)
*H03K 3/16* (2006.01)

(52) U.S. Cl.
CPC ............. *H03K 17/687* (2013.01); *H03K 3/16* (2013.01); *H03F 3/45* (2013.01)
USPC ............. 330/251; 330/10; 330/136; 330/297

(58) Field of Classification Search
CPC ..................................... H03F 3/45; H03F 1/18
USPC .......................................... 330/136, 253, 295
See application file for complete search history.

(56) References Cited

U.S. PATENT DOCUMENTS 6,342,815 B1 * 1/2002 Kobayashi .................... 330/286

FOREIGN PATENT DOCUMENTS

JP 03-117013 5/1991
JP 06-273191 9/1994

(Continued)

OTHER PUBLICATIONS

International Preliminary Report on Patentability and Written Opinion in PCT International Application No. PCT/JP2012/076347, dated Jun. 19, 2014.

(Continued)

*Primary Examiner* — Robert Pascal
*Assistant Examiner* — Khiem Nguyen
(74) *Attorney, Agent, or Firm* — Venable LLP; Michael A. Sartori; George L. Howarah

(57) ABSTRACT

A switching circuit 33 comprises a connection circuit cascade-connecting control terminals for controlling switching of n number of transistors M1-Mn via n−1 number of coils L1 respectively (n is an integer equal to or more than 2; and coils L3 respectively connected between one end of each of the transistors M1-Mn and other end of a coil L2, one end of the coil L2 being electrically connected to a DC power source. The transistors M1-Mn is sequentially switched with PWM signals inputted to an input terminal of the connection circuit. The switching circuit 33 further comprises a transistor M0 inserted at the one end or the other end of the coil L2 in cascade-connection.

9 Claims, 12 Drawing Sheets

(56) References Cited

FOREIGN PATENT DOCUMENTS

| JP | H08-340240 | A | 12/1996 |
|---|---|---|---|
| JP | 2002-033627 | | 1/2002 |
| JP | 2005-506747 | | 3/2005 |
| JP | 2005-168106 | A | 6/2005 |
| JP | 2011-135357 | A | 7/2011 |
| JP | 2011-250011 | A | 12/2011 |
| WO | WO-2011/148710 | A1 | 12/2011 |

OTHER PUBLICATIONS

Notice of Reasons for Rejection in Japanese Patent Application No. 2011-256130, dated Sep. 24, 2014.

* cited by examiner

SWITCHING CIRCUIT AND ENVELOPE SIGNAL AMPLIFIER

CROSS-REFERENCE TO RELATED APPLICATION

This application claims priority to Provisional Application No. 61/563,719 filed on Nov. 25, 2011 and claims the benefit of Japanese Patent Application No. 2011-256130 filed on Nov. 24, 2011, all of which are incorporated herein by reference in their entirety.

BACKGROUND OF THE INVENTION

1. Field of the Invention

The present invention relates to a switching circuit that switches a switching element connected to an inductance element with a pulse width modulation (PWM) signal, and an envelope signal amplifier including the switching circuit.

2. Related Background Art

In recent years, envelope elimination and restoration (EER) has been employed as one of the amplification schemes that amplify high-frequency modulated signals with power amplifiers, e.g., at base transceiver stations for cellular phones. With the EER scheme, an amplitude component (envelope) and a phase component are extracted from a modulated signal to be amplified, and a signal corresponding to the phase component is modulated through amplitude modulation with a signal corresponding to the amplitude component such that the amplitude of the modulated signal is at the same level as that of the original modulated signal.

More specifically, a voltage tracking the extracted envelope is used as a power voltage for a saturated amplifier which amplifies a signal corresponding to the phase component such that the amplitude of the amplified signal tracks the extracted envelope. The aforementioned voltage tracking the envelope can be obtained in a manner such that a modulated signal is amplified through power amplification with a detection signal (referred to as an envelope signal hereinafter) which is detected with the envelope, for example. A saturated amplifier is used for power amplification of the envelope signal for enhanced efficiency. For example, a switching element is switched using a PWM signal that is generated by modulating the pulse width of the envelope signal, and then the resulting PWM signal is integrated, thereby demodulating the envelope signal as a modulated signal.

In order to amplify the PWM signal, a D-class amplifier in which complementary switching elements are connected in a push-pull configuration, and an E-class amplifier in which a switching element is turned on when a voltage applied from an inductance element is zero are often used. Unfortunately, with the D-class amplifier, enhancement of the pressure resistance of the complementary switching elements in a balanced manner is technically difficult. Moreover, with the E-class amplifier, there is a case where a surge voltage greatly exceeds a power voltage depending on the design and operational conditions, the surge voltage being applied to the switching element from the inductance element when the switching element is turned off. As described above, application of the push-pull configuration and the single switching element to a high-frequency, high-power amplifier has limitations.

Furthermore, such a PWM signal includes a relatively low-frequency envelope signal component and a high-frequency PWM signal component; hence an amplifier to meet a broad frequency band is necessary for amplification of the PWM signals. In order to satisfy such conditions, a possible amplifier for the PWM signals is a distribution amplifier, for example, disclosed in Japanese Unexamined Patent Application Publication No. 2002-033627.

SUMMARY OF THE INVENTION

Unfortunately, in the distribution amplifier, power traveling to the other side of an output terminal be consumed through a terminating resistance, thereby the distribution amplifier has a disadvantage of a large loss at a terminating resistor in a distribution constant circuit for combining power to be outputted from a plurality of switching elements. Moreover, a low-pass filter is required to extract an envelope signal as a modulated signal from an amplified PWM signal, which also creates a loss.

An object of the present invention, which has been accomplished to address the above-described problems, is to provide a switching circuit that combines a PWM signals that are amplified through a plurality of switching elements at a low loss and demodulates a modulated signal, and to provide an envelop signal amplifier including the switching circuit.

A first aspect of the present invention provides a switching circuit comprises a connection circuit cascade-connecting control terminals for controlling switching of n number of switching elements via n−1 number of first inductance elements, n is an integer equal to or more than two, respectively, and third inductance elements respectively connected between one end of each of the switching elements and other end of a second inductance element, one end of the second inductance element being electrically connected to a DC power source. The n number of switching elements is sequentially switched with pulse width modulation (PWM) signals inputted to an input terminal of the connection circuit. The switching circuit further comprises an auxiliary switching element inserted at the one end or the other end of the second inductance element in cascade-connection.

In accordance with the first aspect of the present invention, the control terminals for the n number of switching elements are respectively connected to the connection points of the n−1 number of first inductance elements that constitutes the connection circuit through which the PWM signals travel and the input and output terminals of the connection circuit. The third inductance elements are respectively connected between the one end of each of the switching elements and the other end of the second inductance element.

Due to the aforementioned configuration, the switching elements are sequentially switched with the PWM signals traveling through the connection circuit at predetermined time intervals, and the PWM signals respectively amplified at the switching elements and having substantially uniform amplitude are integrated at the other end of the second inductance element. Accordingly, in amplification of the PWM signals having a modulation cycle (PWM cycle) such that one cycle of the modulation cycle equals to "N" times the above-stated time interval, when the signal amplitude and the phase at the one end of each switching element are represented by signal points on a complex plane with respect to the fundamental wave of the PWM signals, the signal points reside at uniform intervals of a $-2\pi/N$ phase difference on a concentric circle with respect to the origin. Thus, the fundamental waves for the PWM signals are cancelled when they are integrated.

When the signal amplitude and phase of the M-th harmonic for the PWM signals at the one end of each switching element are represented by signal points on a complex plane (M is an integer equal to or more than two), the signal points reside at uniform intervals of a $-2M\pi/N$ phase difference on a concentric circle with respect to the origin. Thus, the harmonics for the PWM signals are cancelled when they are integrated.

Consequently, the PWM signals that are amplified at a plurality of switching elements are combined at a low loss, and the modulated signal is demodulated.

The frequencies of modulated signals for cell phones vary. When the frequency of the modulated signal for the cell phone, namely, when the frequency of the envelope signal obtained by detecting the envelop component of the modulated signals decreases, a constant duty ratio for the PWM signal obtained by pulse width modulation of the envelop signal is maintained for a long period of time. This leads to magnetic saturation of the second inductance element in the switching circuit, and therefore, the output voltage comes into the close vicinity of the power voltage.

In accordance with the first aspect of the present invention, however, the auxiliary switching element is turned off prior to the magnetic saturation of the second inductance element, which limits the current traveling through the second inductance element to suppress magnetic flux saturation of the second inductance element. As a result, even though the frequency of the modulated signal for the cell phone decreases, and the duty ratio in the PWM signal is constant for a long time, the output voltage will not come into the close vicinity of the power voltage.

In accordance with the first aspect of the present invention, the auxiliary switching element may be driven at a frequency higher than the inverse of a time constant at which the second inductance element is magnetically saturated.

The switching circuit of the first aspect of the present invention may further include a drive circuit for generating a drive signal by lowering the frequency of the PWM signal, the drive signal driving the auxiliary switching elements.

In accordance with the first aspect of the present invention, each of the n number of switching elements may comprise a first transistor of a first conductivity type, and the auxiliary switching element may comprise a second transistor of a second conductivity type which is different from the first conductivity type.

The switching circuit of the first aspect of the present invention may further comprise a connector electrically connecting the one end of the switching element to the other end of the second inductance element in place of the third inductance element.

In accordance with the first aspect of the present invention, when the connector is disposed between the one end of each switching element and the other end of the second inductance element in place of the third inductance, the parasitic inductance of the connector functions as the third inductance element.

In accordance with the first aspect of the present invention, n may be an integer equal to or more than eight.

In accordance with the first aspect of the present invention, when the amplitude and phase of the M-th harmonic for the PWM signals at the one ends of the switching elements are represented by signal points on a complex plane, the phase difference in the signal points ($-2M\pi/N$) is "M" times the phase difference in the signal points for the fundamental wave ($-2\pi/N$). Namely, all the signal points first overlap at one point at the N-th harmonic (M=N). At n=8, with regard to at least the 2nd to 7th harmonics, the signal points corresponding to the one ends of the switching elements do not overlap on the complex plane, which achieves a practical cancellation of the signals.

In accordance with the first aspect of the present invention, the switching element, the first inductance element, the second inductance element, and the third inductance element may be formed on a semiconductor substrate of a monolithic integrated circuit.

In accordance with the first aspect of the present invention, when the switching circuit is formed on a semiconductor substrate of a monolithic integrated circuit, the switching circuit is compact, achieving high frequency characteristics as an amplifier.

In accordance with the first aspect of the present invention, the switching element may comprise a vertical metal-oxide semiconductor field effect transistor (MOSFET).

In accordance with the first aspect of the present invention, when the switching element is composed of the vertical MOSFET, the switching circuit has high voltage resistance, high-power capacity, and a low electrical resistance in an "ON" state, resulting in a reduction in loss. Furthermore, when the vertical MOSFET is applied for the switching elements in the monolithic integrated circuit, the drain electrodes are disposed on one side of the monolithic integrated circuit, and the source electrodes and the gate electrodes are disposed on the other side thereof. Hence, the length of the wiring from the drain electrodes for the switching elements to the second inductance element is uniform, and the PWM signals amplified at the switching elements are integrated in a balanced manner at the other end of the second inductance element.

A second aspect of the present invention provides an envelope signal amplifier including a modulation circuit conducting pulse width modulation on an analog signal and the switching circuit of the first aspect of the present invention, wherein the switching circuit is switched with pulse width modulation (PWM) signals obtained through pulse width modulation on envelope signal components of modulation signals in the modulation circuit.

In accordance with the second aspect of the present invention, the envelope signal components of the inputted modulated signal are treated with pulse width modulation in the modulation circuit and the switching circuit is switched with the obtained PWM signal, resulting in demodulation of the envelope signal. The switching circuit that can combine the PWM signals amplified at a plurality of switching elements at a low loss and demodulate the modulated signal is employed as the envelope signal amplifier.

In accordance with the second aspect of the present invention, the switching elements are sequentially switched with the PWM signals traveling through the connection circuit at predetermined time intervals, and the PWM signals amplified at the switching elements and having substantially uniform amplitude are integrated at the other end of the second inductance element.

Accordingly, in amplification of the PWM signals having a modulation cycle (PWM cycle) such that one cycle of the modulation cycle equals to "N" times the above-stated time interval, when the signal amplitude and the phase at the one end of each switching element are presented by signal points on a complex plane with respect to the fundamental wave of the PWM signals, the signal points reside at uniform intervals of a $-2\pi/N$ phase difference on a concentric circle with respect to the origin. Thus, the fundamental waves for the PWM signals are cancelled when they are integrated. Similarly, when the amplitude and phase of the M-th harmonic (M is an integer equal to or more than 2) for the PWM signals at the one end of the switching element are represented by signal points on a complex plane, and the signal points reside at uniform intervals of a $-2M\pi/N$ phase difference on a concentric circle with respect to the origin, the fundamental waves for the PWM signals are cancelled when they are integrated.

Consequently, the PWM signals that are amplified at a plurality of switching elements are combined at a low loss, and the modulated signal can be demodulated.

In accordance with the second aspect of the present invention, an auxiliary switching element is turned off prior to the magnetic saturation of the second inductance element, which limits the current traveling through the second inductance element to suppress magnetic flux saturation of the second inductance element. As a result, even though the frequency of the modulated signal for the cell phone decreases, and the duty ratio in the PWM signal is constant for a long time, the output voltage will not come into the close vicinity of the power voltage.

BRIEF DESCRIPTION OF THE DRAWINGS

FIGS. 4A to 4B show the amplitude and phase of signals in connection with the signal points on a complex plane at a drain;

DESCRIPTION OF THE PREFERRED EMBODIMENTS

Embodiments of an envelope signal amplifier including a switching circuit according to the present invention will now be described hereinafter by referring to an amplifier of the EER scheme (referred to as an EER amplifier below) which is used at a base station for cell phones. The present invention may also be applied to other schemes utilizing the envelope signal amplifier, such as an envelope tracking (ET).

First Embodiment

Figure 1:
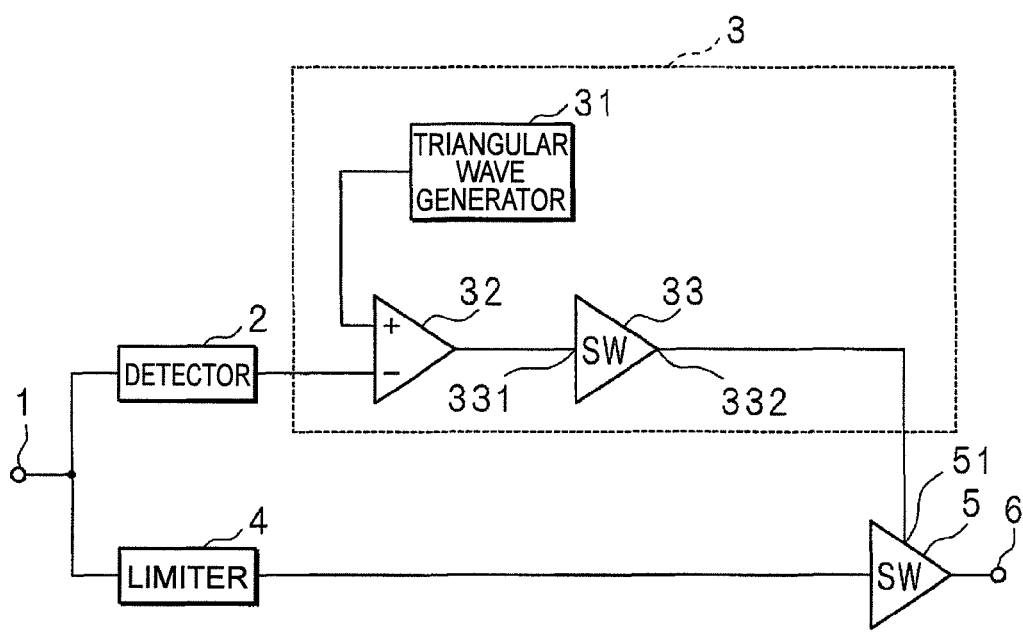
FIG. 1 is a block diagram of the main structure of an EER amplifier according to a first embodiment of the present invention.

FIG. 1 is a block diagram of the main structure of an EER amplifier according to a first embodiment of the present invention. The EER amplifier includes an input terminal 1; a detector 2 that detects an envelope of a modulated signal of a cell phone, the modulated signal being inputted from the input terminal 1; an envelop signal amplifier 3 that amplifies a detected signal (envelop signal); a limiter 4 that limits the amplitude of the inputted modulated signal and extracts a phase component therefrom; and a switching circuit 5 that amplifies the extracted phase component.

The envelop signal amplifier 3 includes a triangular wave generator 31 that generates a triangular wave at a given frequency, and a comparator 32 feeds a PWM signal to the switching circuit 33. The PWM signal is obtained such that the detected signal from the detector 2 is treated with a pulse width modulation by being compared with the triangular wave from the triangular wave generator 31. After a modulation frequency component and harmonic components of the pulse width modulation are eliminated, the PWM signal is amplified by being switched at a switching circuit 33 and is demodulated to an envelope signal which is, in turn, fed to the switching circuit 5. The envelope signal from the switching circuit 33 of the envelop signal amplifier 3 serves as a power voltage for the switching circuit 5, and a switching element (not shown) is switched in accordance with a phase component from the limiter 4, whereby the envelope signal tracks the amplitude of the amplified phase component.

FIGS. 2A, 2B, 2C, 2D, 2E, 2F and 2G schematically illustrate the waveforms of signals at respective elements of the EER amplifier. In FIGS. 2A, 2B, 2C, 2D, 2E, 2F and 2G, the abscissa represents time, whereas the ordinate represents the amplitude of the signals at respective elements. It should be noted that the scale of the ordinates are not uniform in FIGS. 2A, 2B, 2C, 2D, 2E, 2F and 2G.

Figure 2:
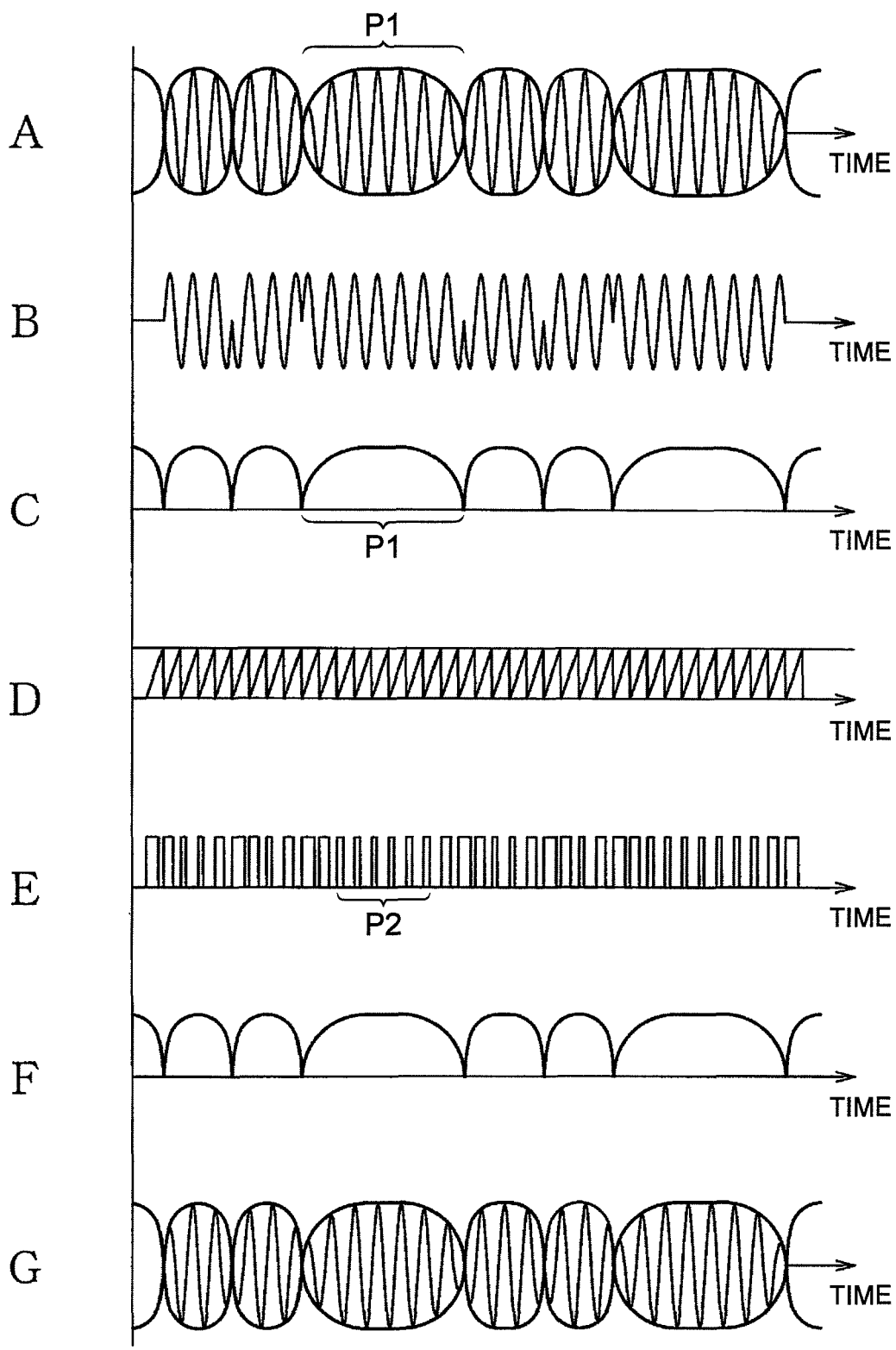
FIGS. 2A, 2B, 2C, 2D, 2E, 2F and 2G schematically illustrate waveforms of signals at various components of an EER amplifier.

FIG. 2A illustrates a waveform of the modulated signal fed to the input terminal 1. The inputted modulated signal is a carrier wave through phase modulation and amplitude modulation. FIG. 2B depicts a waveform of the phase component that is extracted by the limiter 4 from the inputted modulated signal. FIG. 2C shows a waveform of the detected signal (envelope signal) that is obtained through envelope detection on the inputted modulated signal by the detector 2. The amplitude of the phase signal is uniform in FIG. 2B, while the carrier wave component is eliminated from the modulated signal in the envelope signal in FIG. 2C.

FIG. 2D illustrates a waveform of a triangular wave inputted to the comparator 32, and the FIG. 2E illustrates a waveform of the PWM signal on which pulse width modulation is performed after the envelope signal shown in FIG. 2C is compared with the triangular wave at the comparator 32. The pulse width modulation is conducted such that the pulse width of the PWM signal increases as the peak value of the envelope signal decreases, whereas the pulse width of the PWM signal decreases as the peak value of the envelope signal increases. FIG. 2F illustrates a waveform of a signal obtained in a manner such that the polarity of the PWM signal is inverted to be modulated at the switching circuit 33 whereby a modulation frequency component of the pulse width modulation and a frequency component higher than the modulation frequency component are eliminated. Namely, the envelope signal in FIG. 2C corresponds to amplification of the signal in FIG. 2F.

FIG. 2G shows a waveform of an outputted signal when the phase component shown in FIG. 2B is amplified at the switching circuit 5 which employs the envelope signal shown in FIG. 2F as a power source. In this case, the amplitude of the signal outputted from the switching circuit 5 tracks the power voltage and thus a phase signal with the amplitude tracking the envelope signal is outputted from the switching circuit 5. The amplitude component is, therefore, amplified including the phase component of the modulated signal shown in FIG. 2A, thereby outputting the signal shown in FIG. 2G from the EER amplifier.

According to the first embodiment of the present invention, the modulation frequency of the pulse width modulation, that is, the frequency of the triangular waves generated by the triangular wave generator 31 is, but should not limited to, 200 MHz. However, it is preferred that the frequency should be approximately ten times the bandwidth of the envelope signal.

Figure 3:
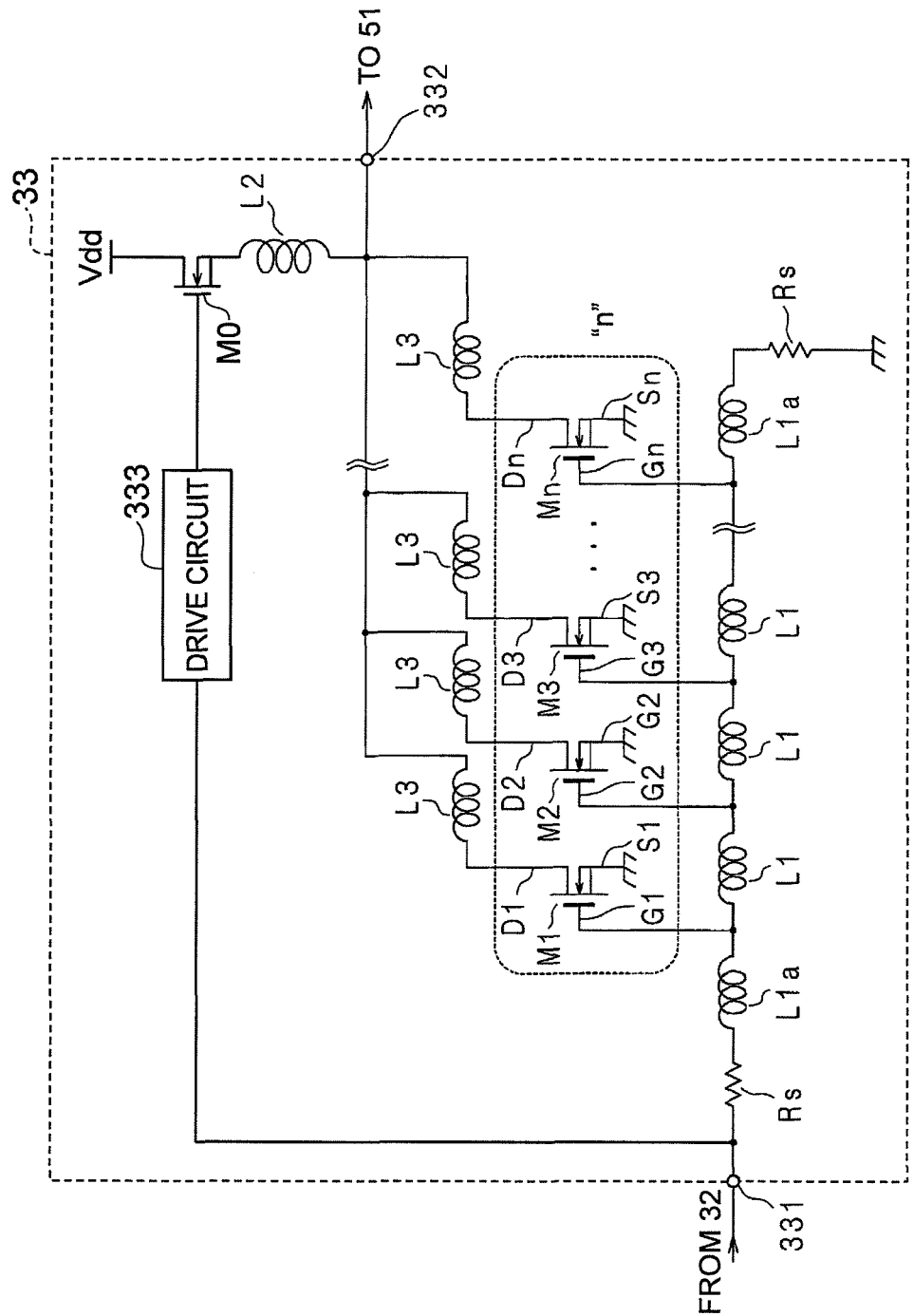
FIG. 3 illustrates the configuration of a switching circuit according to a first embodiment of the present invention.

FIG. 3 depicts the configuration of the switching circuit 33 according to the first embodiment of the present invention. The switching circuit 33 includes a power Vdd, a coil L2, drains D1 to Dn (n is an integer equal to or larger than 2), a coils L3, n number of transistors M1 to Mn which are metal-oxide semiconductor field-effect transistors (MOSFETs), sources S1 to Sn, and an output terminal 332. An end of the power Vdd is electrically connected to one end of the coil L2. The coils L3 are disposed between other end of the coil L2 and the drains D1 to Dn, respectively. The sources S1 to Sn for the respective transistors M1 to Mn are connected to a ground potential. The other end of the coil L2 is connected to the output terminal 332.

n−1 number of Coils L1 are disposed between the transistors Mk to Mk+1 (k is an integer from 1 to n−1) and gates Gk to Gk+1, respectively. The n−1 number of coils L1 and a stray capacitance Cgs (not shown) for the gates G1 to Gn constitute a connection circuit. The one and other ends of the connection circuit are connected to an input terminal 331 and the ground potential, respectively via the corresponding series circuits composed of a coil L1a and a termination resistance Rs. A capacitor C1, which will be described below, may be disposed between the termination resistance Rs and the ground potential. The impedance for the termination resistance Rs equals to the characteristic impedance for the connection circuit.

The switching circuit 33 further includes a transistor M0 that is a metal-oxide semiconductor field-effect transistor (MOSFET). The transistor M0 is disposed between the power Vdd and the coil L2 such that they are connected in cascade connection. A drain for the transistor M0 is connected to the power Vdd, whereas a source is connected to the one end of the coil L2. A drive signal from a drive circuit 333 is inputted to a gate of the transistor M0. The drive circuit 333 generates a drive signal from the PWM signal, which is inputted from the comparator 32 via the input terminal 331, by lowering the frequency of the PWM signal.

The pulse width of the drive signal is determined such that the duration of time while the transistor M0 is "on" is smaller than a time constant when the coil L2 is magnetically saturated. Alternatively, the drive signal is determined such that the frequency of the drive signal is higher than a half of the inverse of the time constant when the coil L2 is magnetically saturated. Preferably, the frequency of the drive signal should be higher than the inverse of the time constant when the coil L2 is magnetically saturated. In this way, the transistor M0 is turned off before the coil L2 is magnetically saturated, which will be discussed in detail hereinafter. Since the transistor M0 does not require high-speed operation as compared to the transistors M1 to Mn, a relatively inexpensive transistor can be used for the transistor M0.

In the switching circuit 33, the comparator 32 feeds the PWM signal to the terminate resistance Rs via the input terminal 331 and the PWM signal is fed to a gate Gm (m is an integer from 1 to n) at a predetermined time interval while traveling through the connection circuit. This predetermined time interval is 1/n of the modulation cycle of the pulse width modulation. That is, the PWM signal whose phase is retarded by $2\pi(m-1)/n$ relative to the gate G1 is fed to the gate Gm. When the PWM signal reaches the gate Gm of a transistor Mm, the transistor Mm switches between the coil L3 connected to a drain Dm and the ground potential, and thus the amplified PWM signal with an inverted polarity is fed to the output terminal 332 via the coil L3 from the drain Dm. Thus, a signal outputted from the other end of the coil L2, that is, the output terminal 332 is the sum of the PWM signals with uniform amplitude outputted from the drains D1 to Dn via the respective coils L3.

Mechanism of integration of the PWM signals provided to the output terminal 332 from the drains Dm of the transistors Mm will now be described with a case of n=8.

Figure 4:
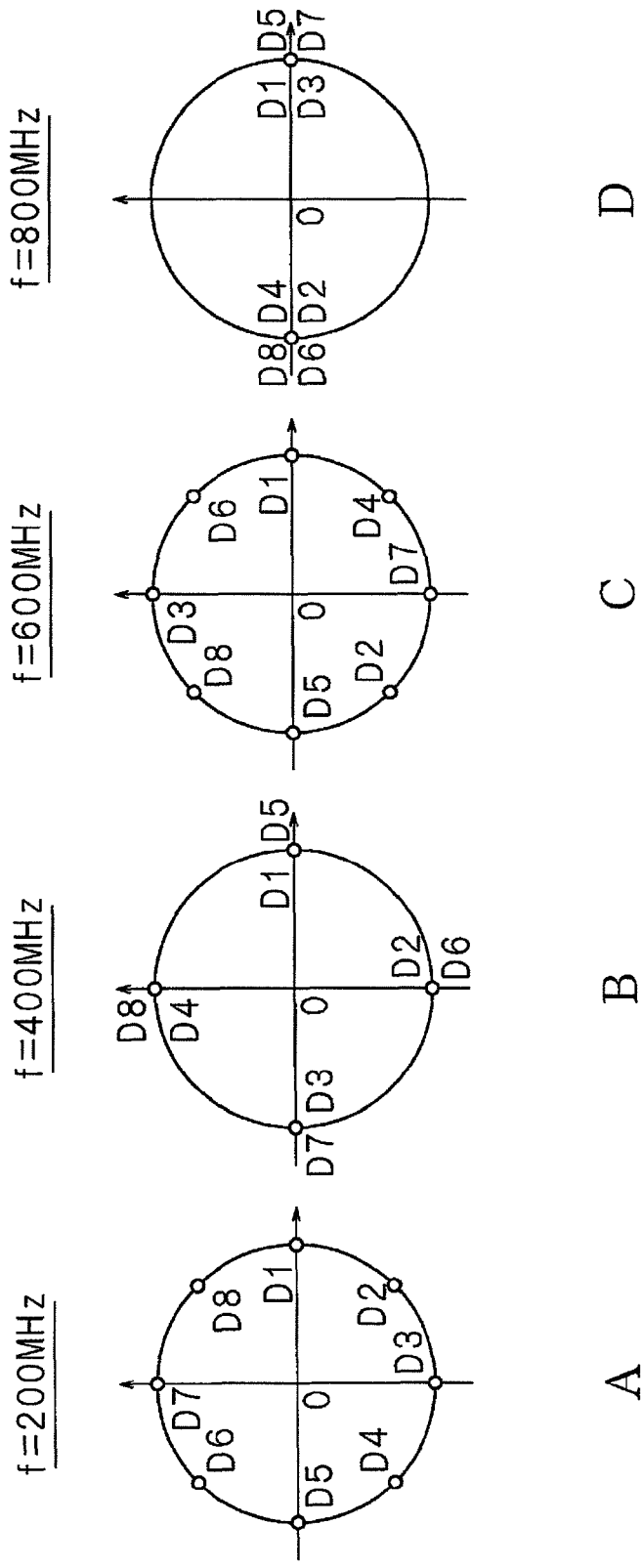
FIGS. 4A, 4B, 4C and 4D are complex planes where the amplitude and phase of the signals at drains are represented by signal points.

FIGS. 4A, 4B, 4C and 4D are complex planes where the amplitude and phase of the signals at the drains D1 to D8 are represented by signal points. In FIGS. 4A, 4B, 4C and 4D, the abscissa represents the real axis whereas the ordinate represents the imaginary axis. FIG. 4A shows signal points corresponding to a fundamental wave having a frequency the same as the modulation frequency of the pulse width modulation, which is 200 MHz in this case. FIGS. 4B, 4C and 4D show signal points for harmonics of the order of 2, 3, and 4, respectively.

In FIG. 4A, when the signal point for the drain D1 is set on the real axis, the signal points for the drains D1 to D8 are present on a concentric circle due to the uniform amplitude of the signals at the drains D1 to D8. The transistors M1 to M8 are sequentially switched at time intervals of 1/8 of the modulation cycle of pulse width modulation, i.e., the cycle of the fundamental wave. Namely, the transistors M1 to M8 are sequentially switched with a phase difference of $-\pi/4$. Accordingly, the phase difference of the adjacent signal points for the drains D1 to D8 is $-\pi/4$ ($-2\pi/8$).

Similarly, in FIG. 4B, the transistors M1 to M8 are sequentially switched at time intervals of 2/8 of the cycle of the second harmonic, that is, with a phase difference of $-\pi/2$. Accordingly, the phase difference of the adjacent signal points for the drains D1 to D8 is $-\pi/2$ ($-2\times2\pi/8$). In FIG. 4C, the phase difference of the adjacent signal points for the drains D1 to D8 is $-3\pi/4$ ($-3\times2\pi/8$). In FIG. 4D, the phase difference of the adjacent signal points for the drains D1 to D8 is $-\pi(-4\times2\pi/8)$.

The signal points shown in FIGS. 4A, 4B, 4C and 4D are symmetrical with respect to the origin, which indicates that when the signals at the drains D1 to D8, which correspond to the signal points in the drawings, are uniformly integrated, the signals are canceled into a signal with no amplitude. In contrast, the signal outputted from the output terminal 332 is the sum of the signals outputted from the drains D1 to Dn. Accordingly, at n=8, at least the fundamental wave and the 2nd, 3rd, and 4th harmonics are cancelled at the output terminal 332.

With regard to the 5th, 6the, and 7th harmonics (not shown), the phase difference of the adjacent signal points for the drains D1 to D8 are $-5\pi/4$ ($-5\times2\pi/8$), $-3\pi/2$ ($-6\times2\pi/8$), and $-7\pi/4$ ($-7\times2\pi/8$), respectively. With these harmonics, when the signals at the drains D1 to D8 are integrated, the resulting signal has no amplitude.

On the contrary, the 8th harmonic, the phase difference of the adjacent signal points for the drains D1 to D8 is $-2\pi$ ($-8\times2\pi/8$) and thus all the signal points overlap at one point. Thus, when the signals at the drains D1 to D8 are integrated, the resulting signal is not cancelled, which leads to an assumption that the amplitude becomes large by the number of the signals that are integrated.

The aforementioned facts lead to the following conclusion: the fundamental wave and the (n−1)th or lower harmonics for the pulse width modulation are cancelled when the signal is outputted from the output terminal 332 of the switching circuit 33 in FIG. 3. Namely, the output terminal 332 of the switching circuit 33 outputs the envelope signal shown in FIG. 2F.

How the number of transistors in the switching circuit 33, that is, the number of stages of amplification of the PWM signal affects the cancellation of the fundamental wave and the harmonics will now be described hereinafter.

Figure 5:
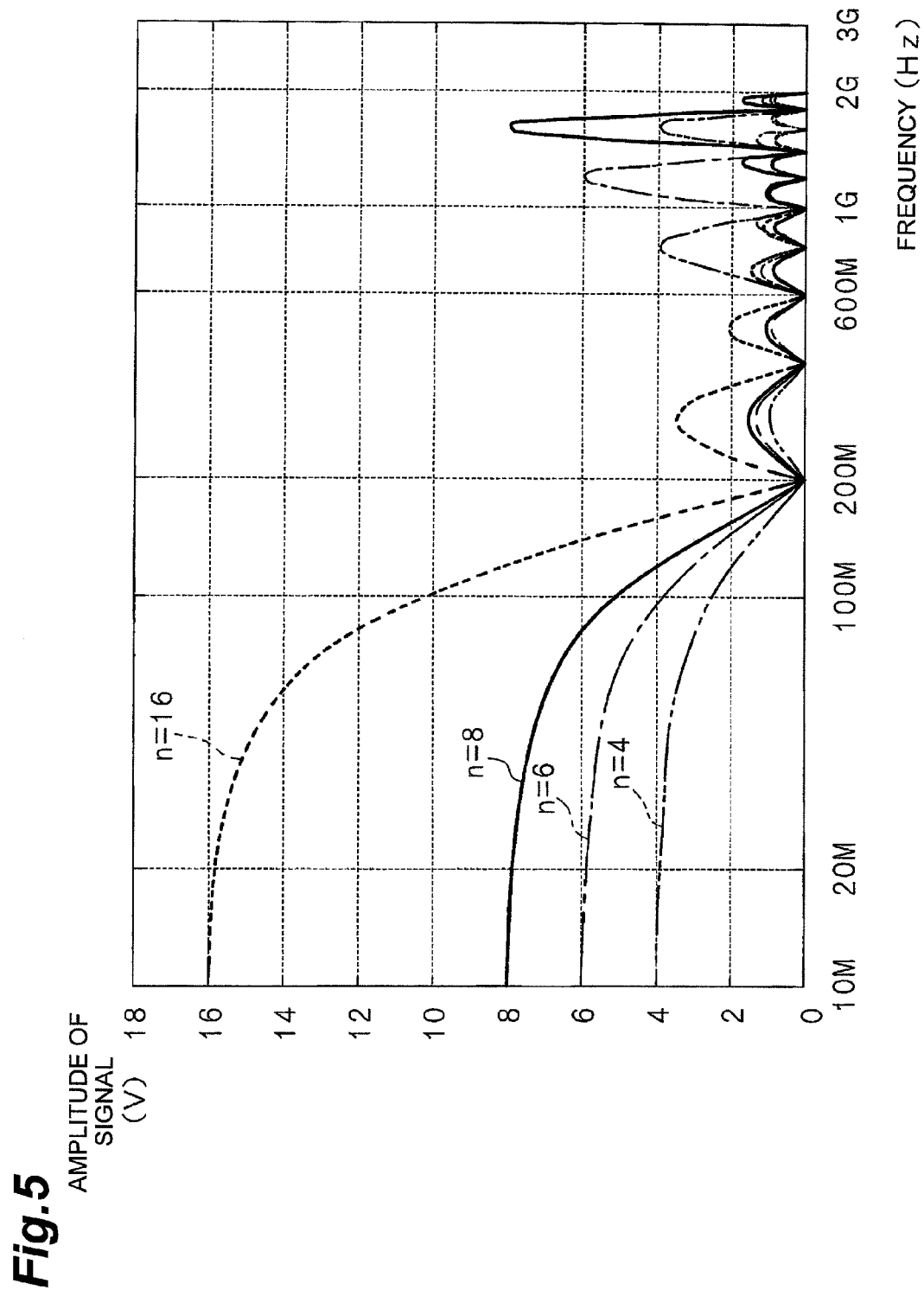
FIG. 5 is a graph showing cancellation characteristics of a fundamental wave and harmonics with respect to the number (n) of stages of amplification (n)

FIG. 5 is a graph showing how the fundamental wave and harmonics are cancelled with respect to the number of stages of amplification represented by "n". In the drawing, the abscissa represents frequency (Hz), whereas the ordinate represents the amplitude (V) of the signal at the output terminal 332. The amplitudes of signals at n=4, n=6, n=8, and n=16 are denoted by a dashed-two dotted line, a dashed-dotted line, a solid line, and a dashed line, respectively. FIG. 5 shows a simulation where the transistors M1 to Mn are switched with the PWM signal in order to obtain the amplitude of signal of 1 V per one stage of amplification. At a frequency significantly lower than the fundamental wave of pulse width modulation, that is, 200 MHz, signals outputted from the transistors M1 to Mn are integrated with a substantially uniform phase and thus the amplitude (V) of the resulting signal corresponds to the number of stages of amplification "n".

At n=4, the fundamental wave and the 2nd and 3rd harmonics for the pulse width modulation are cancelled at the output terminal 332. Accordingly, at frequencies of 200 MHz, 400 MHz, and 600 MHz, the amplitude of the signal of harmonics becomes zero. As described above, the 4th harmonic is integrated at the output terminal 332, the amplitude of signal at a frequency of 800 MHz has a peak as represented by the dashed-two dotted line. Such a peak also appears in the 8th harmonic (the order of 4 multiplied by 2) at a frequency of 1.6 GHz.

At n=6, the fundamental wave and the 2dn to 5th harmonics for the pulse width modulation are cancelled at the output terminal 332. Accordingly, at frequencies of every 200 MHz within the range from 200 MHz to 1 GHz, the amplitude of the signals of the harmonics becomes zero. Since the 6th harmonic is integrated at the output terminal 332, the amplitude of signals at a frequency of 1.2 GHz has a peak as represented by the dashed-dotted line.

At n=8, the fundamental wave and harmonics of the order of 2 to 7 for the pulse width modulation are cancelled at the output terminal 332. Accordingly, at frequencies of every 200 MHz within the range from 200 MHz to 1.4 GHz, the amplitude of the signals of the harmonics becomes zero. Since the 8th harmonic is integrated at the output terminal 332, the amplitude of signals at a frequency of 1.6 GHz has a peak as represented by the solid line.

At n=16, the fundamental wave and harmonics of the order of 2 to 15 for the pulse width modulation are cancelled at the output terminal 332. Accordingly, at frequencies within the range from 200 MHz to 3 GHz, the amplitude of the signals of the harmonics becomes zero. No peak will appear in the amplitude of signal at the frequency range shown in FIG. 5.

As described above, with the number of amplification stages of 8 or above, harmonics with frequencies within the range from 200 MHz to 1.4 GHz are cancelled, whereby cancellation of harmonics is practically achieved.

As has been described above, according to the first embodiment, gates for the n number of transistors are respectively provided at the connection nodes of the n−1 number of coils, which constitute the connection circuit through which the PWM signal travels and the input and output terminals of the connection circuit. Third coils are respectively provided between the drains of the transistors and the other end of the second coil whose one end is connected to the power Vdd.

Accordingly, due to the PWM signals traveling through the connection circuit, the transistors are sequentially switched at time intervals of 1/n of the modulation cycle of the pulse width modulation, and the PWM signals with substantial uniform amplitude that are amplified at the respective transistors are integrated at the other end of the second coil. Thus, when the amplitude and phase of the signals at the drains of the transistors are presented by the signal points on the complex plane, with respect to the fundamental wave and the (n−1)th or smaller harmonics for the pulse width modulation, at a phase difference of −2kπ/8 (k is an integer from 1 to n−1), the signal points reside at uniform intervals on a concentric circle with respect to the origin. Thus, the fundamental waves for the PWM signals are cancelled when they are integrated. Namely, the fundamental wave and harmonics for the pulse width modulation can be eliminated by integrating the PWM signals in place of a transmission channel or filter that causes a great loss.

The PWM signals that are amplified at a plurality of switching elements are combined at a low loss, and the envelope signal, that is, a modulated signal can be demodulated.

When the amplitude and phase of the M-th harmonic for the PWM signals at the drains of the transistors are represented by signal points on a complex plane, the phase difference in the signal points (−2Mπ/n), is "M" times the phase difference in the signal points for the fundamental wave (−2π/n). Namely, all the signal points first overlap at one point at the n-th harmonic (M=n).

At n=8, with regard to at least the 2nd to 7th harmonics, the signal points corresponding to the drains of the transistors do not overlap on the complex plane, which achieves a practical cancellation of the signals.

A comparator performs pulse width modulation on the envelop signal, that is, a modulated signal inputted to the EER amplifier, and the transistors are switched with the PWM signals obtained through the pulse width modulation to synthesize the envelope signal to be demodulated.

Accordingly, the PWM signals that are amplified at a plurality of transistors are combined at a low loss, and a switching circuit capable of demodulating modulated signals can be applied to the envelop signal amplifier.

The operation and effects of the above-described switching circuit 33 and the transistor M0 will now be described hereinafter.

The frequencies of modulated signals for cell phones vary. If the switching circuit 33 was not provided with the transistor M0 and the drive circuit 333, the following may happen. When the frequency of the modulated signals for a cell phone decreases, the output voltage at the output terminal 332 could become very close to the power Vdd.

More specifically, if the frequency of the modulated signal for the cell phone is low, which is indicated by P1 where the frequency of the amplitude modulation is low in FIG. 2A, namely, if the frequency of the envelop signal obtained by envelop detection of the modulated signal is low, which is indicated by P1 in FIG. 2C, a state where the duty ratio is constant for the PWM signals obtained by performing the pulse width modulation on the envelop signals continues, the state being indicated by P2 in FIG. 2E.

Figure 6:
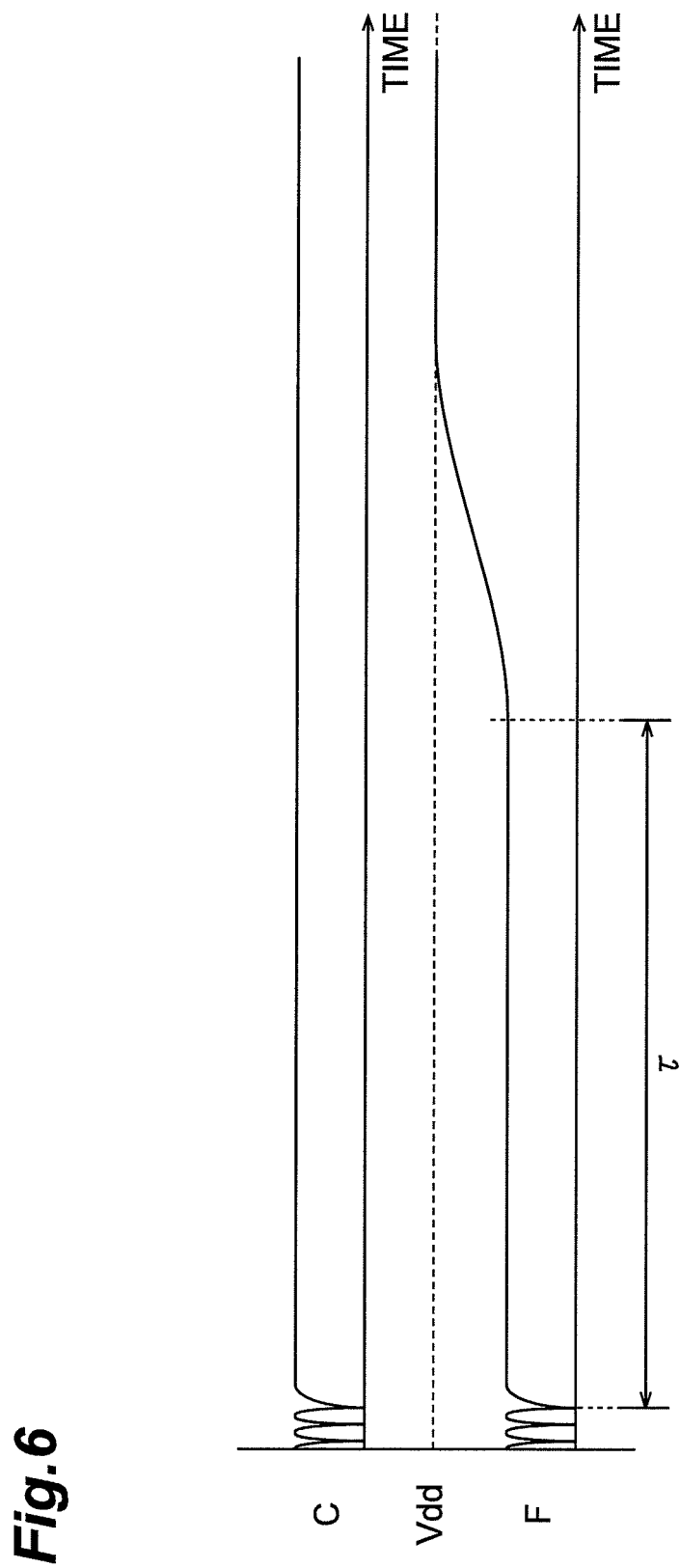
FIG. 6 schematically illustrates waveforms of signals at several components of the EER amplifier which does not include a transistor M0 when the frequency of a modulated signal of a cell phone decreases.

FIG. 6 illustrates the waveform C of an envelop signal in a case where the frequency of the modulated signal for the cell phone further decreases, and the waveform F of an output voltage at the output terminal 332 in the switching circuit 33. The waveform C in FIG. 6 demonstrates that, when the frequency of the modulated signal for the cell phone, namely, when the frequency of the envelope signal further decreases, and a state where the duty ratio is constant for the PWM signal continues for a long period of time, the coil L2 is magnetically saturated. Thus, the output voltage at the output terminal 332 in the switching circuit 33 becomes very close to the power Vdd, as shown by the waveform F in FIG. 6. The time constant "τ" of the waveform F in FIG. 6 represents a time until the coil L2 is magnetically saturated.

Figure 7:
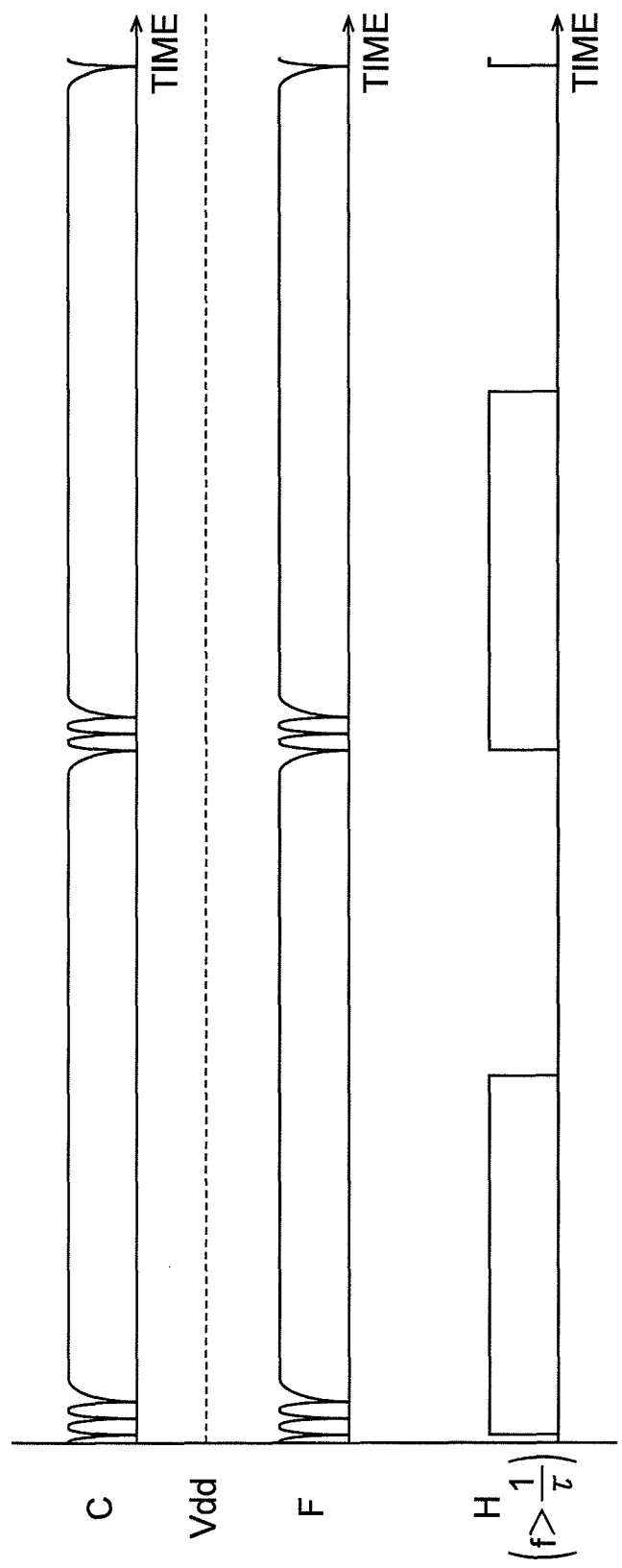
FIG. 7 schematically illustrates waveforms of signals at several components of the EER amplifier which includes a transistor M0 when the frequency of a modulated signal of a cell phone decreases.

The switching circuit 33 according to the first embodiment includes the transistor M0 cascade-connected to the coil L2, and the transistor M0 is turned off prior to the magnetic saturation of the coil L2. FIG. 7 illustrates the waveform C of an envelope signal, the waveform F of an output voltage at the output terminal 332 of the switching circuit 33, and the waveform H of a drive signal at the transistor M0. The waveform H in FIG. 7 demonstrates that, when the transistor M0 is driven at a higher frequency than an inverse of the time constant τ at which the coil L2 is magnetically saturated, for example, namely, when the transistor M0 is turned off prior to magnetic saturation of the transistor M0, the current traveling through the coil L2 is limited to suppress magnetic flux saturation of the coil L2. As a result, even though the frequency of the modulated signal for the cell phone decreases, and the duty ratio in the PWM signal is constant for a long time, the output voltage at the output terminal 332 of the switching circuit 33 will not come into the close vicinity of the power Vdd.

Figure 8:
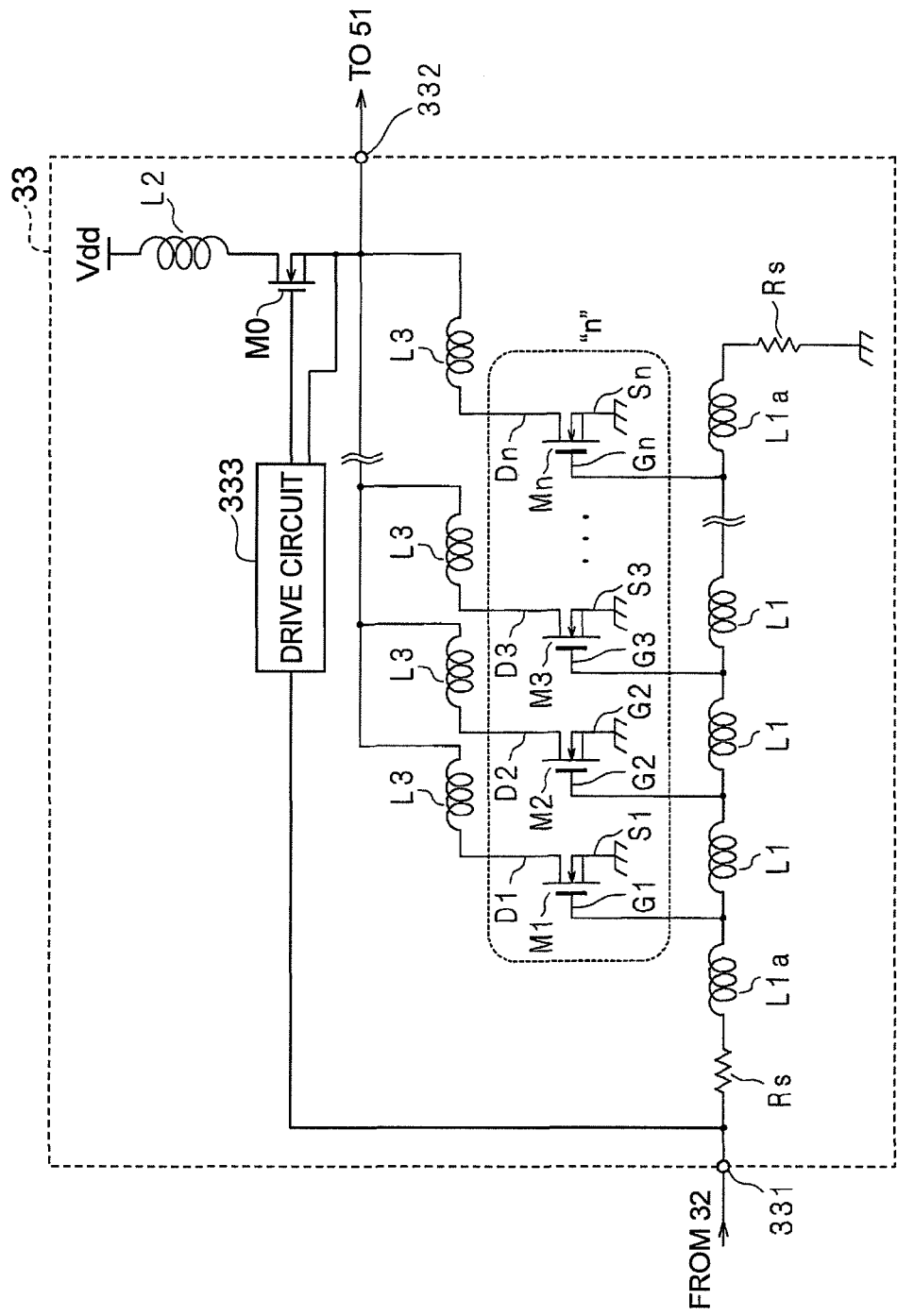
FIG. 8 illustrates the configuration of a switching circuit according to a modification of the first embodiment.

The present invention is not limited to the first embodiment but various modifications are feasible. In the first embodiment, the transistor M0 is disposed between the power Vdd and the coil L2, that is, the transistor M0 is connected to the one end of the coil L2 in cascade connection. As shown in FIG. 8, the transistor M0 may be connected to the other end of the coil L2 in cascade connection. In this case, a gate voltage for the transistor M0 may be determined in relative to the source voltage.

Figure 9:
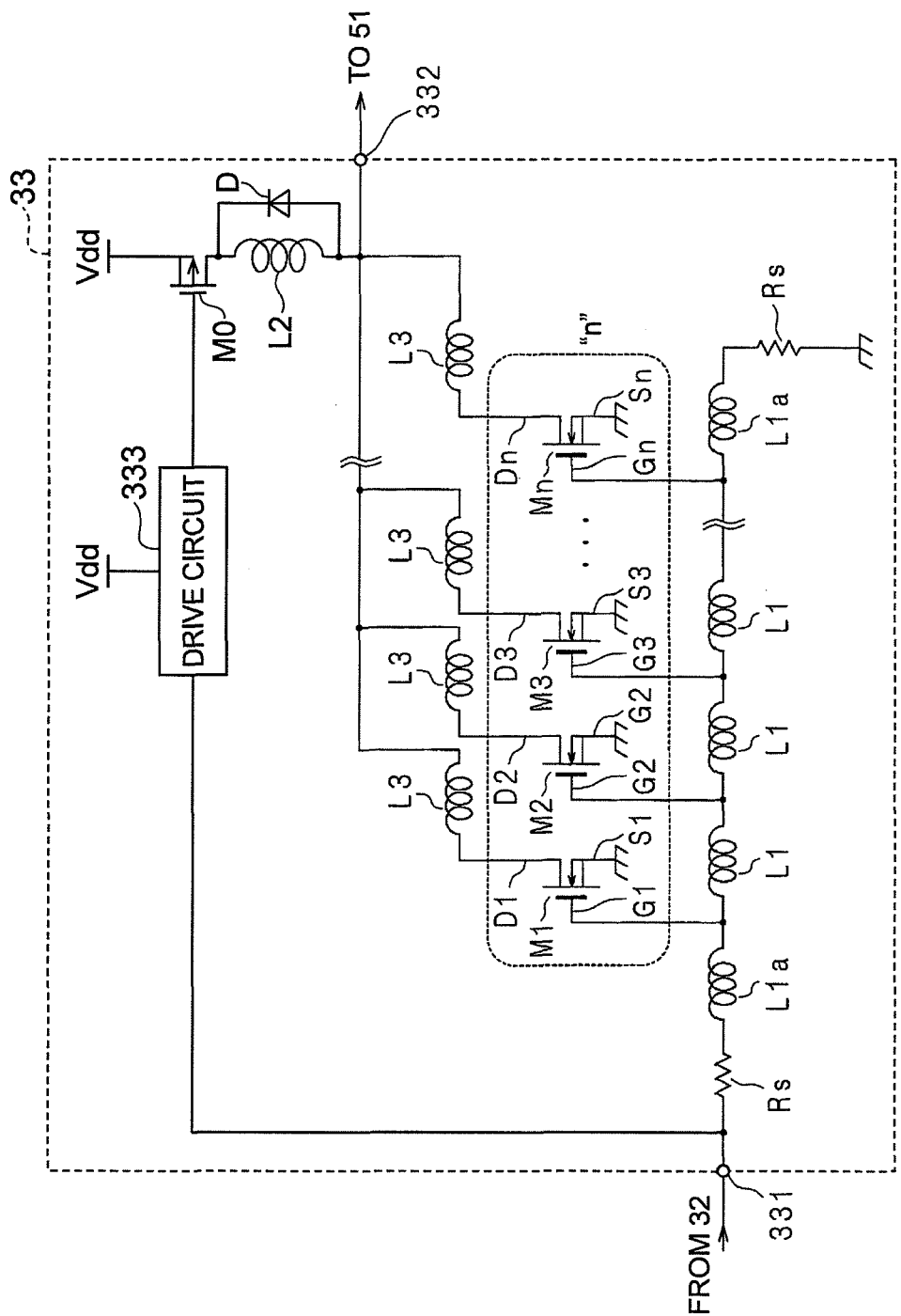
FIG. 9 illustrates the configuration of a switching circuit according to a modification of the first embodiment.

Although the transistor M0 in the first embodiment is an n-type transistor like the transistors M1 to Mn, the transistor M0 may be a p-type transistor as shown in FIG. 9. With a p-type transistor M0, the gate voltage is determined with reference to the power Vdd, which can be readily controlled.

Although in the first embodiment the transistor M0 is an electric field effect transistor, various switching elements such as a bipolar transistor or an insulated gate bipolar transistor (IGBT) may be employed.

According to the first embodiment, the power voltage is a positive voltage Vdd but a negative voltage Vss may be applied to the present invention. In this case also, the transistor M0 may be an N-type transistor different from the P-type transistors M1 to Mn. In other words, the transistor M0 may be of a second conducive type which is different from a first conductive type of transistors. The second conductive type transistor also exhibits the aforementioned effects.

According to the first embodiment, a diode may be connected to the coil L2 in parallel as shown in FIG. 9. Specifically, the cathode of the diode is connected to the one end of the coil L2 in a vicinity of the power Vdd and the anode is connected to the other end of the coil L2. In this way, the transistor M0 and the transistors M1 to Mn are turned off, which suppresses a back electromotive force of the coil L2 which is induced when a current stops traveling through the coil L2.

Figure 10:
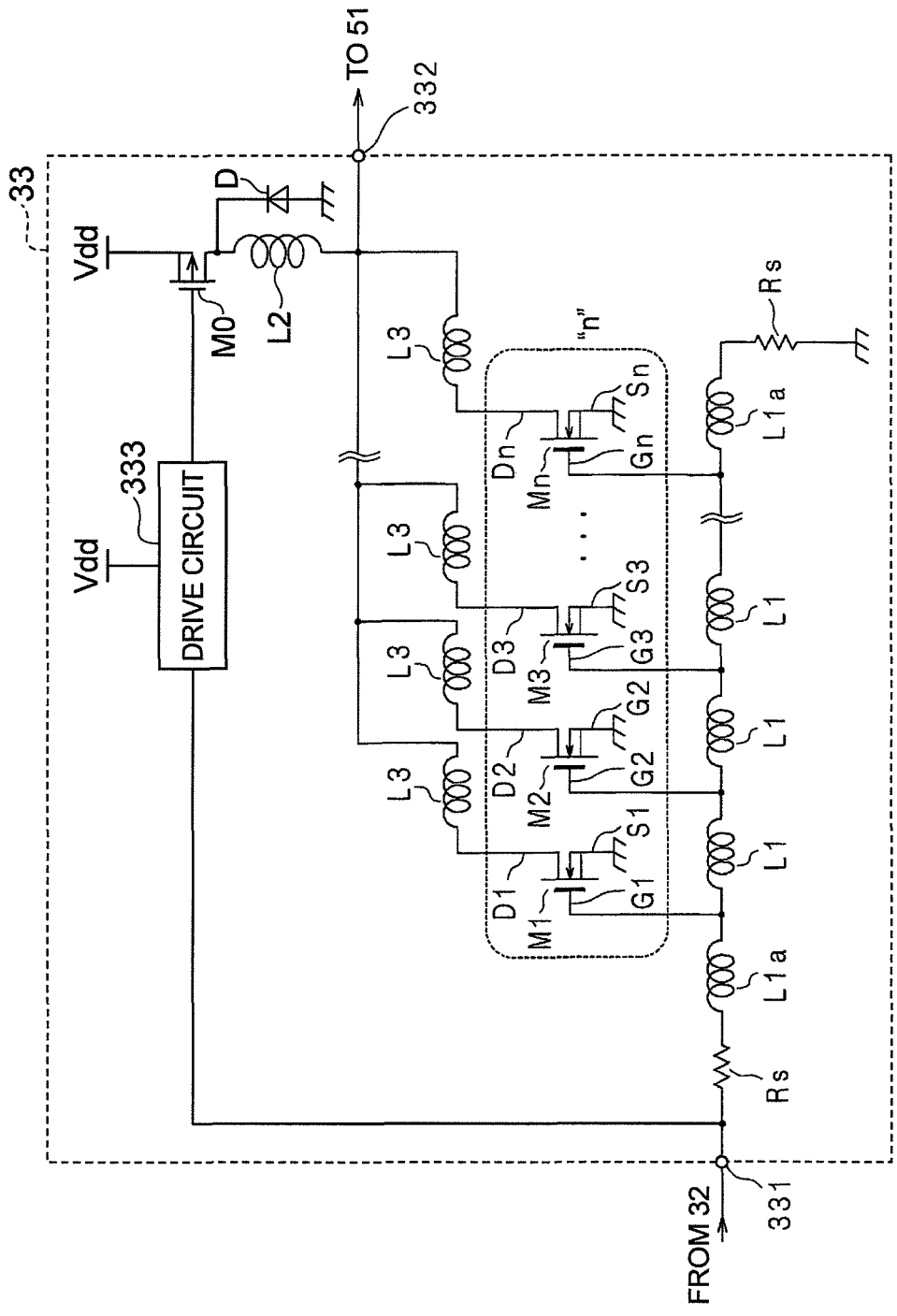
FIG. 10 illustrates the configuration of a switching circuit according to a modification of the first embodiment.

According to the first embodiment, as shown in FIG. 10, a diode may be disposed between the one end of the coil L2 close to the power Vdd and the ground potential. More specifically, the cathode (or anode) of the diode is connected to the one end of the coil L2 close to the power Vdd and the anode (or cathode) of the coil L2 is connected to the ground potential. In this case, even though the transistor M0 is turned off, a current is supplied to the coil L2.

Second Embodiment

The switching circuit 33 of the first embodiment can include discrete electronic components on a circuit board. According to a second embodiment of the present invention, however, a switching circuit is disposed in the form of an integrated circuit (IC) on a semiconductor substrate.

Figure 11:
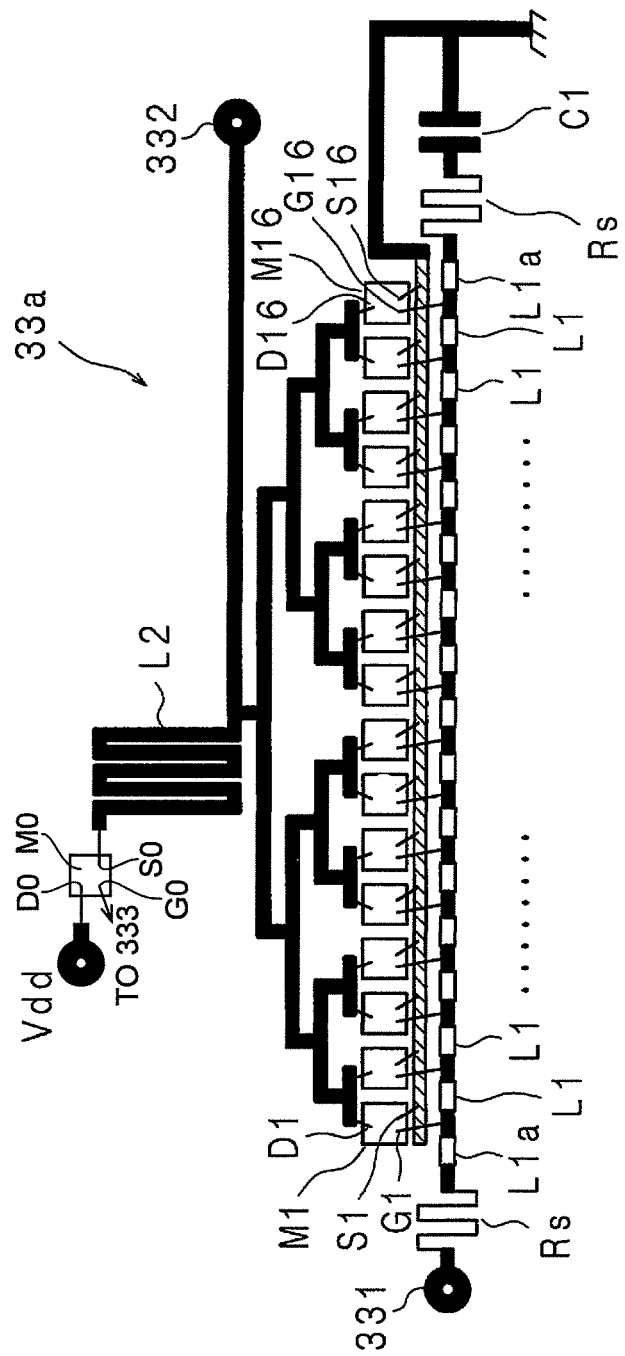
FIG. 11 is a schematic plane view of a switching circuit according to a second embodiment of the present invention.

FIG. 11 is a schematic plane view of a switching circuit 33a according to the second embodiment of the present invention. The switching circuit 33a is disposed on a semiconductor substrate which is a monolithic integrated circuit. The switching circuit 33a includes a coil L2, drains D1 to D16, sixteen transistors M1 to M16, and sources S1 to S16. One end of the coil L2 is electrically connected to a power Vdd. A conductive pattern, i.e., a connector is disposed between other end of the coil L2 and the drains D1 to D16 to connect them. The sources S1 to S16 for the respective transistors M1 to M16 are connected to a ground potential which is partly indicated by the slant lines in FIG. 11. Other end of the coil L2 is connected to an output terminal 332 of the switching circuit 33a.

The transistors M1 to M16 and gates G1 to G16 therefor are respectively connected to the both ends of fifteen coils L1 connected in series and connection points. The fifteen coils L1 and a stray capacitance Cgs (not shown) for the gates G1 to G16 constitute a connection circuit. One end and other end of the connection circuit are respectively connected to an end of an input terminal 331 and an end of a capacitor C1 via a series circuit composed of a coil L1a and termination resistance Rs, respectively. The other end of the capacitor C1 is connected to a ground potential. The capacitor C1 blocks a DC bias voltage for the gates G1 to G16.

The coil L2, the coils 1, the coils L1a, the termination resistances Rs, and the capacitor C1 are composed of a conductive pattern. The conductive pattern (connectors), which connects the other end of the coil L2 and the drains D1 to D16, has parasitic inductance and is provided in place of the coils L3 of the switching circuit 33 according to the first embodiment. Specifically, according to the second embodiment, the aforementioned parasitic inductance of the conductive pattern and the inductance of the wiring from semiconductor chips for the transistors M1 to M16 to the drains D1 to D16 serve as the coils L3 of the first embodiment.

The switching circuit 33a further includes a transistor M0 which is connected to the power Vdd and the coil L2 in series therebetween. A drain D0 for the transistor M0 is connected to the power Vdd, and a source S0 is connected to the one end of the coil L2. A gate G0 for the transistor M0 is connected to an output of a drive circuit 333. Although the drive circuit 333 is not illustrated in FIG. 11, the drive circuit 333 may be disposed on the same semiconductor substrate or on a separate semiconductor substrate.

According to the switching circuit 33a having the above described configuration, while PWM signals provided to the termination resistance Rs from the input terminal 331 travels through the connection circuit including the fifteen coils L1, the transistors M1 to M16 are subsequently switched. The PWM signals that are amplified at the transistors M1 to M16 and outputted from the drains D1 to D16 are integrated at the coil L2, whereby a fundamental wave and harmonics for the pulse width modulation are cancelled at the output terminal 332, as in the switching circuit 33 of the first embodiment.

The transistor M0 is turned off prior to magnetic flux saturation of the coil L2 and thus a current traveling through the coil L2 is limited, thereby suppressing magnetic flux saturation of the coil L2. Consequently, even though the frequency of the modulated signal for a cell phone decreases, for example, and therefore the duty ratio of the PWM signals continues to be constant for a long time, an output voltage does not come into the close vicinity of the power Vdd, similar to the switching circuit 33 of the first embodiment.

Since the switching circuit 33a of the second embodiment is disposed on the monolithic integrated circuit, the circuit is compact. Thus, the switching circuit 33a exhibits preferred frequency characteristics as compared to the configuration where discrete components are disposed on a circuit board composed of an insulating material. The same members as the first embodiment are denoted by the same reference numerals and the detailed descriptions are omitted here.

According to the second embodiment of the present invention, the connecting member is disposed between the drains of the transistors and the other end of the coil L2 in place of the third coils of the first embodiment. Accordingly, the parasitic inductance of the connecting member serves as the third coils of the first embodiment.

Being disposed on the semiconductor substrate which is a monolithic integrated circuit, the switching circuit of the second embodiment is compact, thereby exhibiting preferable high frequency characteristics.

Third Embodiment

According to a third embodiment of the present invention, a high-voltage resistance, high-power vertical MOSFET is disposed on a semiconductor substrate, while a lateral MOSFET is disposed on the semiconductor substrate in the second embodiment.

FIG. 12A is a schematic plane view of the front side of a switching circuit 33b according to the third embodiment of the present invention. FIG. 12B is a schematic plane view of the back side of the switching circuit 33b according to the third embodiment of the present invention. The switching circuit 33b is disposed on a semiconductor substrate of a monolithic integrated circuit. Vertical transistors M1 to M8, which are MOSFETs, are disposed in a circle in the switching circuit 33b. Sources 51 to S8 and gates G1 to G8 of the transistors M1 to M8, respectively, are disposed on the front side of the semiconductor substrate, whereas drains D1 to D8 are disposed on the back side thereof.

The sources S1 to S8 of the transistors M1 to M8 are connected to a circular conductive pattern, which is, in turn, connected to a ground potential. The gates G1 to G8 of the transistors M1 to M8 are connected to both ends of seven coils L1 and connecting points. The seven coils L1 are disposed in a circle and connected in series. The seven coils L1, the gates G1 to G8, and a stray capacitance Cgs (not shown) constitute a connection circuit. One and other ends of the connection circuit is respectively connected to an input terminal 331 and a capacitor C1 via a series circuit composed of a coil L1a and a termination resistance Rs. The other end of the capacitor C1 is connected to a ground potential.

The switching circuit 33b includes a coil L2 that has one end and other end. The one end of the coil L2 is connected to a power Vdd, and the other end of the coil L2 is connected to a point that is connected to the drains D1 to D8 of the transistors M1 to M8 at an identical distance from the point on the back side of the semiconductor substrate. The other end of the coil L2 functions as an output terminal 332 of the switching circuit 33b. The aforementioned conductive pattern (connector) has parasitic inductance and is provided in place of the coils L3 of the switching circuit 33 of the first embodiment.

The switching circuit 33b further includes a transistor M0 connected in series between the power Vdd and the coil L2. The source S0 and a gate G0 of the transistor M0 are disposed on the front side of the semiconductor substrate, whereas the drain D0 is disposed on the back side. The drain D0 of the transistor M0 is connected to the power Vdd. The source S0 disposed on the front side of the semiconductor substrate is connected to the one end of the coil L2 through, e.g., a via hole on the back side. The gate G0 is connected to an output of a drive circuit 333. The drive circuit 333 is not illustrated in the FIG. 12. The drive circuit 333 may be disposed on the same semiconductor substrate or on a separate semiconductor substrate.

According to the switching circuit 33b having the above described configuration, while PWM signals provided to the termination resistance Rs from the input terminal 331 travels through the connection circuit including the seven coils L1, the transistors M1 to M8 are sequentially switched. The PWM signals that are amplified at the transistors M1 to M8 and outputted from the drains D1 to D8 are integrated at the coil L2, whereby the fundamental wave and harmonics for the pulse width modulation are cancelled at the output terminal 332, as in the switching circuit 33 of the first embodiment.

The transistor M0 is turned off prior to magnetic flux saturation of the coil L2 and thus a current traveling through the coil L2 is limited, thereby suppressing magnetic flux saturation of the coil L2. Consequently, even though the frequency of the modulated signal for a cell phone decreases, for example, and therefore a constant duty ratio of the PWM signals is maintained for a long time, an output signal does not come into the close vicinity of the power Vdd, similar to the first embodiment.

Figure 12:
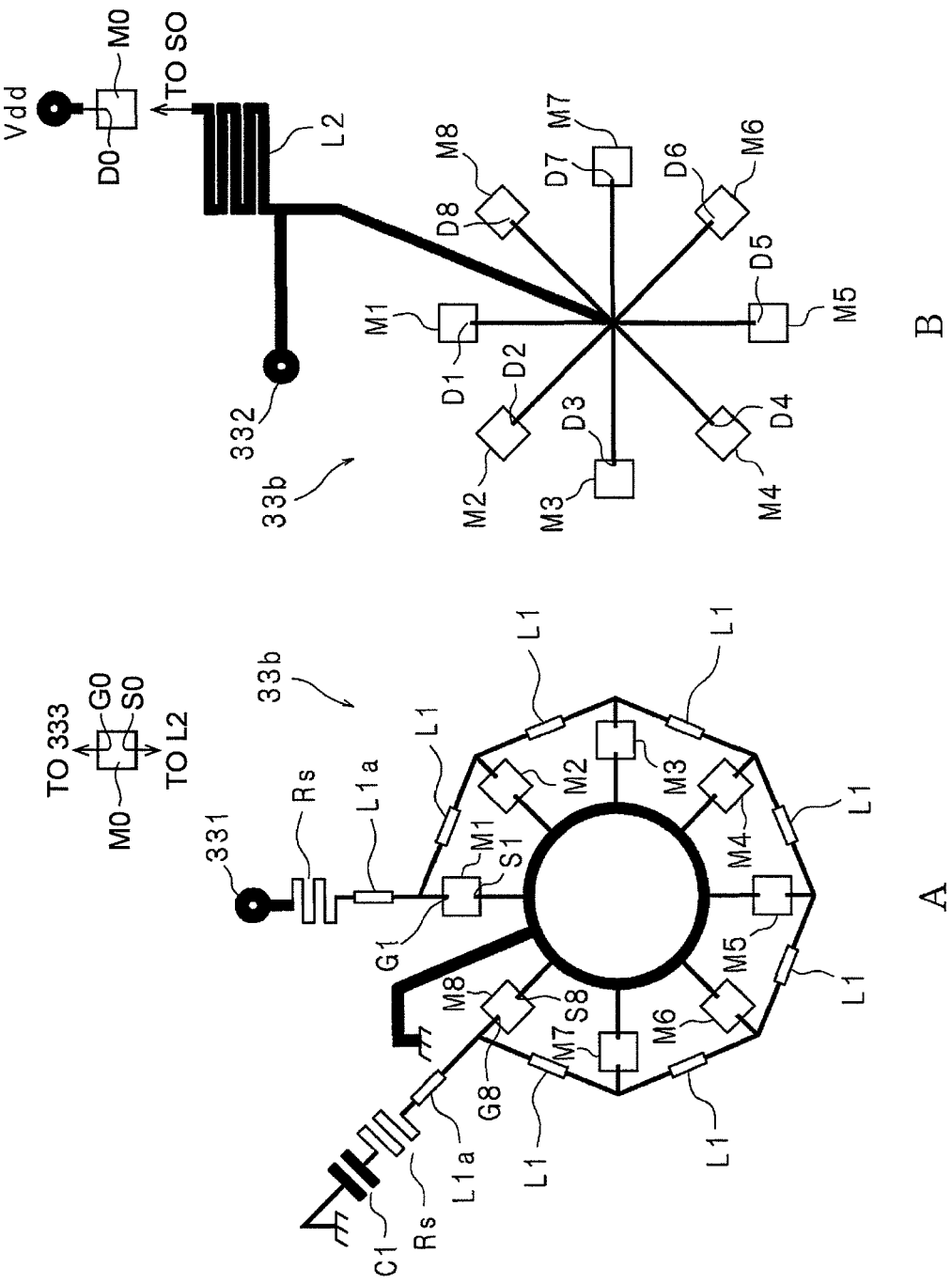
FIGS. 12A to 12B are schematic plane views of a switching circuit according to a third embodiment of the present invention.

According to the switching circuit 33b, the sources S1 to S8 and the gates G1 to G8 are disposed on the front side of the semiconductor substrate, and the drains D1 to D8 are disposed on the back side thereof in the monolithic integrated circuit, which enhances the design flexibility of wiring. As shown in FIG. 12, the transistors M1 to M8 are disposed in a circle, this makes the lengths of the conductive patterns (wiring members), which are respectively connected to the drains D1 to D8 at a specific point, uniform and thus the parasitic inductance uniform. Accordingly, the PWM signals outputted from the drains D1 to D8 are integrated in a balanced manner. The same members as the first and second embodiments are denoted by the same reference numerals and the detailed descriptions are omitted here.

As has been described above, since the transistors of the third embodiment are composed of the vertical MOSFET, the switching circuits has high voltage resistance, high-power capacity, and a low electrical resistance in an "ON" state, resulting in a reduction in loss.

According to the third embodiment, since the drain electrodes are disposed on one side of the monolithic integrated circuit, and the source electrodes and the gate electrodes are provided on the other side thereof, the length of the wiring from the drain electrodes for the transistors to the other end of the coil L2 are uniform. Consequently, the PWM signals amplified at the transistors are integrated in a balanced manner at the other end of the coil L2.

What is claimed is:
1. A switching circuit comprising:
  a connection circuit cascade-connecting control terminals for controlling switching of n number of switching elements via n−1 number of first inductance elements, n is an integer equal to or more than two, respectively; and
  third inductance elements respectively connected between one end of each of the switching elements and other end of a second inductance element, one end of the second inductance element being electrically connected to a DC power source ; wherein the n number of switching elements is sequentially switched with pulse width modulation (PWM) signals inputted to an input terminal of the connection circuit, and the switching circuit further comprises an auxiliary switching element inserted at the one end or the other end of the second inductance element in cascade-connection.

2. The switching circuit according to claim 1, wherein the auxiliary switching element is driven at a frequency higher than the inverse of a time constant at which the second inductance element is magnetically saturated.

3. The switching circuit according to claim 2, further comprising a drive circuit for generating a drive signal by lowering a frequency of the PWM signal, the drive signal driving the auxiliary switching elements.

4. The switching circuit according to claim 1, wherein each of the n number of switching elements comprise a first transistor of a first conductivity type, and the auxiliary switching element comprises a second transistor of a second conductivity type which is different from the first conductivity type.

5. The switching circuit according to claim 1, further comprising a connector electrically connecting the one end of each of the switching elements to the other end of the second inductance element in place of the third inductance elements.

6. The switching circuit according to claim 1, wherein n is an integer equal to or more than eight.

7. The switching circuit according to claim 1, wherein the switching elements, the first inductance elements, the second inductance element, and the third inductance elements are formed on a semiconductor substrate of a monolithic integrated circuit.

8. The switching circuit according to claim 1, wherein each of the Switching elements comprises a vertical metal-oxide semiconductor field effect transistor (MOSFET).

9. An envelope signal amplifier comprising:
a modulation circuit conducting pulse width modulation on an analog signal; and
the switching circuit as recited in claim 1,
wherein the switching circuit is switched with pulse width modulation (PWM) signals obtained through pulse width modulation on envelope signal components of modulated signals in the modulation circuit.

* * * * *